(12) United States Patent
Han (10) Patent No.: US 9,703,628 B2
(45) Date of Patent: Jul. 11, 2017

(54) MEMORY DEVICE AND SYSTEM INCLUDING THE SAME

(71) Applicant: SK hynix Inc., Gyeonggi-do (KR)

(72) Inventor: Ju Hyeon Han, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 12 days.

(21) Appl. No.: 14/831,442

(22) Filed: Aug. 20, 2015

(65) Prior Publication Data

US 2016/0266967 A1    Sep. 15, 2016

(30) Foreign Application Priority Data

Mar. 12, 2015   (KR) .......................... 10-2015-0034342

(51) Int. Cl.
| | | |
|---|---|---|
| G11C 29/00 | (2006.01) | |
| G06F 11/10 | (2006.01) | |
| G06F 12/00 | (2006.01) | |
| G06F 11/00 | (2006.01) | |
| G11C 29/04 | (2006.01) | |

(52) U.S. Cl.
CPC .......... *G06F 11/1048* (2013.01); *G06F 11/00* (2013.01); *G06F 12/00* (2013.01); *G11C 2029/0411* (2013.01)

(58) Field of Classification Search
CPC .... G06F 11/1068; G06F 3/0679; G06F 3/064; G06F 3/0619; G06F 11/1072; G06F 11/1048; G11C 29/52; G11C 11/5642; G11C 29/021; G11C 16/26; G11C 16/3404; G11C 29/028; G11C 7/14; G11C 11/5628; H03M 13/458; H03M 13/451; H03M 13/152
See application file for complete search history.

(56) References Cited

U.S. PATENT DOCUMENTS

| | | | | |
|---|---|---|---|---|
| 9,128,858 | B1* | 9/2015 | Micheloni | ............... G06F 11/10 |
| 2011/0238886 | A1* | 9/2011 | Post | .................... G06F 12/0246 |
| | | | | 711/103 |
| 2011/0246852 | A1* | 10/2011 | Sabbag | ............... G06F 11/1048 |
| | | | | 714/755 |
| 2012/0005558 | A1* | 1/2012 | Steiner | ............... G06F 11/1072 |
| | | | | 714/773 |
| 2012/0084490 | A1* | 4/2012 | Choi | ...................... G11C 16/02 |
| | | | | 711/103 |
| 2012/0317460 | A1* | 12/2012 | Chilappagari | ...... G06F 11/1048 |
| | | | | 714/773 |

(Continued)

FOREIGN PATENT DOCUMENTS

| | | |
|---|---|---|
| KR | 1020140028543 | 3/2014 |
| KR | 1020140059821 | 5/2014 |
| KR | 1020140084298 | 7/2014 |

*Primary Examiner* — Guerrier Merant
(74) *Attorney, Agent, or Firm* — IP & T Group LLP (57) ABSTRACT

Disclosed is a memory device including: a plurality of memory blocks suitable for storing data; peripheral circuits suitable for temporarily storing data read from a selected memory block, performing a randomization operation to the read data, and performing an ECC decoding operation to the randomized data; and a control logic suitable for controlling the peripheral circuits to repeat the randomization operation and the ECC decoding operation until the ECC decoding operation is successful, and a system including the same.

19 Claims, 5 Drawing Sheets

(56) References Cited

U.S. PATENT DOCUMENTS

2015/0333776 A1* 11/2015 Bolotov .............. H03M 13/458
714/780
2016/0125951 A1* 5/2016 Sun .................... G11C 11/5642
365/185.24

* cited by examiner

MEMORY DEVICE AND SYSTEM INCLUDING THE SAME

CROSS-REFERENCE TO RELATED APPLICATION

The present application claims priority to Korean patent application number 10-2015-0034342, filed on Mar. 12, 2015, the entire disclosure of which is herein incorporated by reference in its entirety.

BACKGROUND

1. Field

The present application relates to a memory device and a system including the same, and more particularly, to a memory device capable of performing a read operation and a system including the same.

2. Discussion of Related Art

Memory devices have multiple memory blocks, each including memory cell arrays. In addition, there are peripheral circuits configured to perform program, read, and erase operations on the memory cell arrays, and a control logic to control the peripheral circuits.

Non-volatile memory devices need to retain data over time, even without a constant source of power. However, data stored in the memory blocks may be distorted due to differences in memory block electrical characteristics. When a read error is generated, the control logic of the memory device determines whether the error may be corrected using an error correction code (ECC). When the number of error bits is greater than error correction capability of the memory device, the control logic determines that the error is uncorrectable, and the corresponding memory block is designated as a bad block.

SUMMARY

The present application has been made in an effort to provide a memory device capable of improving reliability of memory devices by correcting an error of a page, the number of error bits of which is greater than the error correction capability of the memory device, and a system including the same.

An exemplary embodiment of the present application provides a memory device including: a plurality of memory blocks suitable for storing data; peripheral circuits suitable for temporarily storing data read from a selected memory block among the memory blocks, performing a randomization operation to the read data, and performing an ECC decoding operation to the randomized data; and a control logic suitable for controlling the peripheral circuits to repeat the randomization operation and the ECC decoding operation until the ECC decoding operation is successful, and a system including the same.

Another exemplary embodiment of the present application provides a system, including: a storage device; and a host suitable for controlling the storage device, in which when it is determined that an error of read data is uncorrectable, the storage device randomizes the read data until the error of read data is correctable.

According to the exemplary embodiments of the present application, a page of the memory device may be made correctable even when the number of error bits of the page is greater than error correction capability of the memory device, and therefore reliability of the memory device and the system including the same may be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and advantages of the present application will become more apparent to those of ordinary skill in the art by describing in detail embodiments thereof with reference to the attached drawings in which.

DETAILED DESCRIPTION

An exemplary embodiment of the present application will be described in detail with reference to the accompanying drawings. However, the present application is not limited to embodiments to be disclosed below, and other forms may be implemented.

Figure 1:
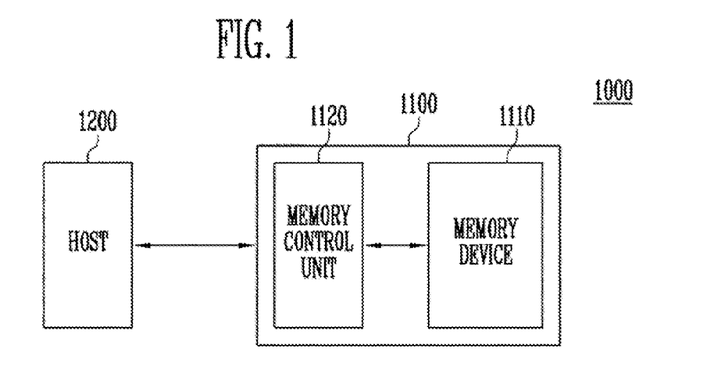
FIG. 1 is a diagram illustrating a system including a memory device according to an exemplary embodiment of the present application.

FIG. 1 is a diagram illustrating a system 1000 including a memory device 1110 according to an exemplary embodiment of the present application.

Referring to FIG. 1, the system 1000 may include a storage device 1100 and a host 1200 controlling the storage device 1100. The storage device 1100 may include the memory device 1110 and a memory control unit 1120 controlling the memory device 1110.

The host 1200 may communicate with the storage device 1100 by using an interface protocol, such as Peripheral Component Interconnect-Express (PCI-E), Advanced Technology Attachment (ATA), Serial ATA (SATA), Parallel ATA (PATA), or serial attached SCSI (SCSI). Further, the interface protocols between the host 1200 and the storage device 1100 are not limited to the aforementioned example, and may be one among other interface protocols, such as Universal Serial Bus (USB), Multi-Media Card (MMC), an Enhanced Small Disk Interface (ESDI), and Integrated Drive Electronics (IDE).

The memory control unit 1120 may control the storage device 1100, and control data exchange between the host 1200 and the memory device 1110. For example, the memory control unit 1120 may control the memory device 1110 to program or read data in response to a request from the host 1200.

Depending on the embodiment, the memory device 1110 may include a double data rate synchronous dynamic random access memory (DDR SDRAM), a low power double data rate 4 (LPDDR4) SDRAM, a graphics double data rate (DDDR) SDRAM, a low power DDR (LPDDR), a Rambus dynamic random access memory (RDRAM), or a flash memory.

Figure 2:
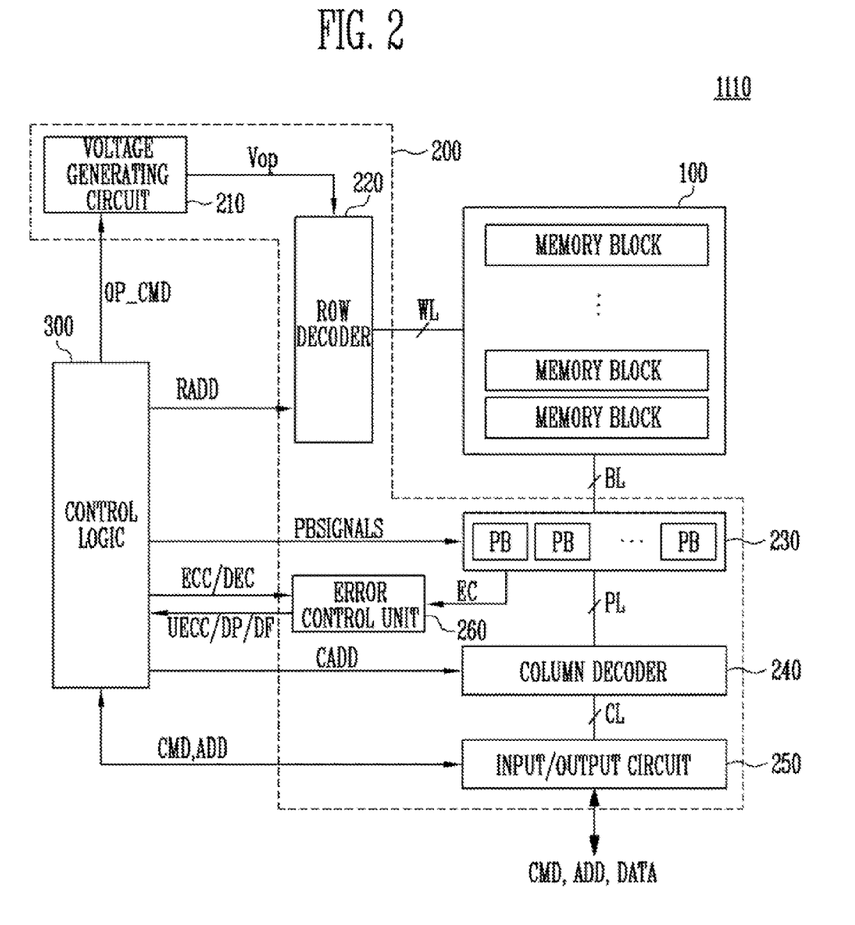
FIG. 2 is a diagram illustrating a memory device shown in FIG. 1.

FIG. 2 is a diagram illustrating the memory device 1110 shown in FIG. 1.

Flash memory will be used as an example of the memory device 1110.

The memory device 1110 may include a memory cell array 100, peripheral circuits 200 configured to program data in the memory cell array 100, read stored data, and erase stored data, and a control logic 300 configured to control the peripheral circuits 200.

The memory cell array 100 may include a plurality of memory blocks. The memory blocks may be connected to word lines WL and bit lines BL. The word lines WL may be connected to the memory blocks, respectively, and the bit lines BL may be connected to the memory blocks.

The peripheral circuit 200 may include a voltage generating circuit 210, a row decoder 220, a page buffer unit 230, a column decoder 240, an input/output circuit 250, and an error correction unit 260.

The voltage generating circuit 210 may generate operation voltages Vop having various levels for the program, read, and erase operations in response to an operation command OP_CMD. For example, during a data restoration operation, the voltage generating circuit 210 may generate read voltages having various levels, and generate a first read voltage, a second read voltage less than the first read voltage by a first level, and a third read voltage greater than the first read voltage by the first level. The data restoration operation will be described later.

The row decoder 220 may transmit the operation voltages Vop to the word lines WL connected to a selected memory block in response to a row address RADD.

The page buffer unit 230 may include a plurality of page buffers PB connected to the bit lines BL. The page buffers PB may transceive data through the bit lines BL, and temporarily store data received from the selected memory block.

The column decoder 240 may transceive data with the page buffers PB through page lines PL in response to a column address CADD.

The input/output circuit 250 may transmit a command CMD and an address ADD received from the memory control unit 1120 to the control logic 300, or transceive data with the column decoder 240 through column lines CL.

The error control unit 260 may receive error data EC through the page buffer unit 230 in response to an error correction command ECC, and determine whether an error of the received is correctable by checking the number of error bits of the received error data is greater than the error correction capability of the memory device 1110. When it is determined that the error is uncorrectable, the error control unit 260 may transmit an uncorrectable error signal UECC, which represents that the error of the received error data is uncorrectable, to the control logic 300. Further, the error control unit 260 may perform a decoding operation on the error data EC in response to a decoding command DEC, and transmits a pass signal DP or a fail signal DF as a result of the decoding operation to the control logic 300.

The control logic 300 may output the operation command OP_CMD, the row address RADD and a page buffer control signal PBSIGNALS in response to the command CMD and the address ADD in order to control the peripheral circuits 200, output the error correction command ECC to the error control unit during the read operation, and output the decoding command EDC to the error control unit 250 for the data restoration operation upon receiving the uncorrectable error signal UECC from the error control unit 260. Further, the control logic 300 may control the peripheral circuits 200 to perform the data restoration operation in response to the pass signal DP or the fail signal DF from the error control unit 260.

Figure 3:
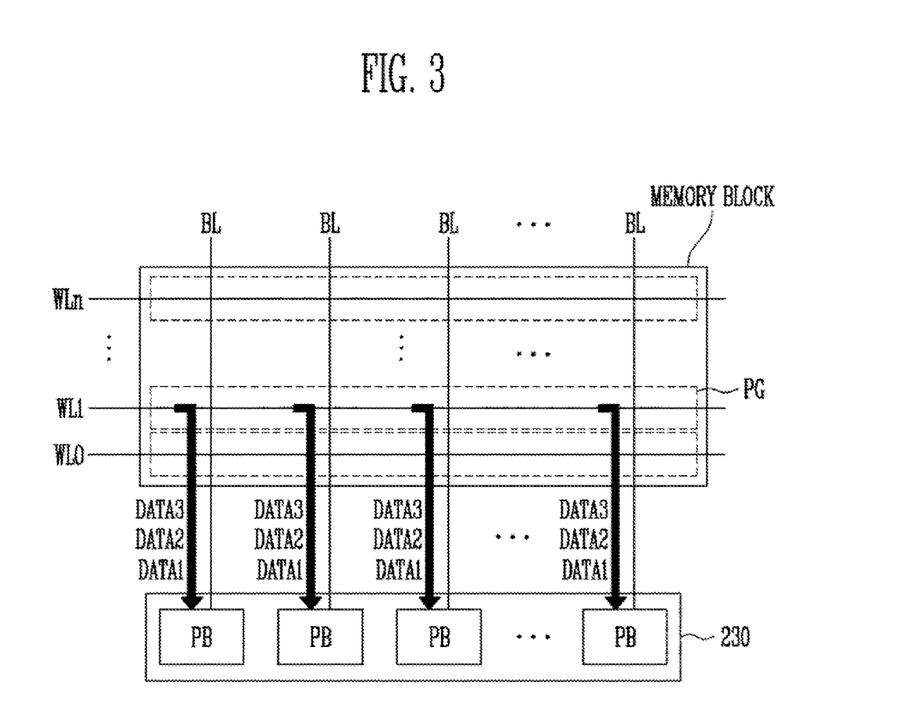
FIG. 3 is a diagram illustrating a read operation of a memory device shown in FIGS. 1 and 2.

FIG. 3 is a diagram illustrating a read operation of the memory device 1110 shown in FIGS. 1 and 2.

Referring to FIG. 3, the memory blocks may include a plurality of cell strings (not shown) connected to the bit lines BL, and a plurality of memory cells (not shown) may be included in each of the cell strings. The word lines WL0 to WLn may be connected to the memory cells. A group of the memory cells connected to the same word line WL0 to WLn is referred to as a page PG. The read operation and the program operation may be performed in one page PG units.

The page buffer unit 230 may include page buffers PB connected to bit lines BL. During the read operation, first data DATA1, second data DATA2, and third data DATA3 of the memory cells included in a selected page PG may be transmitted to the page buffers PB through the bit lines BL, respectively. The read operation of the page PG connected with the first word line WL1 will be described as an example. It is assumed that data read by applying the first read voltage to the first word line WL1 is the first data DATA1, data read by applying the second read voltage less than the first read voltage to the first word line WL1 is the second data DATA2, and data read by applying the third read voltage greater than the first read voltage to the first word line WL1 is the third data DATA3. In this case, the first to third data DATA1 to DATA3 sequentially transmitted through the bit lines BL may be temporarily stored in the page buffers PB, respectively.

Figure 4:
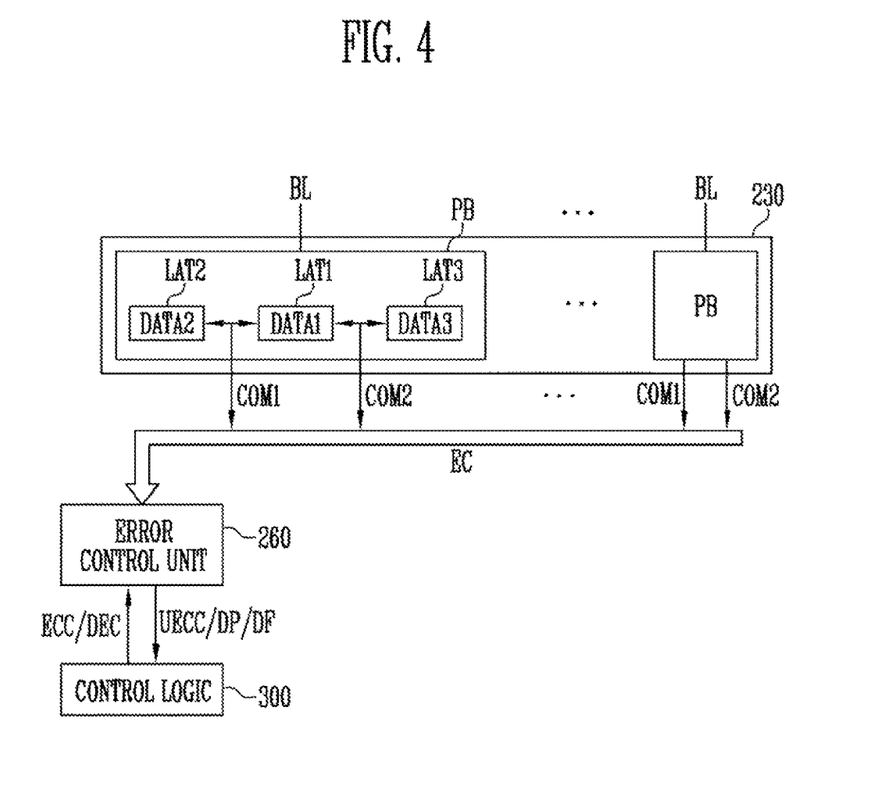
FIG. 4 is a diagram illustrating an ECC operation of a memory device shown in FIGS. 1 and 2.

FIG. 4 is a diagram illustrating an ECC operation of the memory device 1110 shown in FIGS. 1 and 2.

Referring to FIG. 4, each of the page buffers PB may include a plurality of latches LAT1, LAT2, and LAT3. During the read operation, the first data DATA1 may be stored in a first latch LAT1 the second data DATA2 may be stored in a second latch LAT2, and the third data DATA3 may be stored in a third latch LAT3 among the plurality of latches LAT1 LAT2, and LAT3. When all of the first to third data DATA1 to DATA3 are stored in the page buffers PB, the error data EC of the selected page PG may be detected according to a first comparison value COM1 obtained by comparing the first data DATA1 with the second data DATA2 and a second comparison value CPM2 obtained by comparing the first data DATA1 and the third data DATA3. The error data EC may be detected by various methods. For example, when the second and third data DATA2 and DATA3 stored in the second and third latches LAT2 and LAT3 are transmitted to the first latch LAT1 and then the first data DATA1 stored in the first latch LAT1 is changed, the error data EC may be detected. Otherwise, when the second and third data DATA2 and DATA3 are loaded to a line, to which the first data DATA1 is loaded, and then a voltage or a current of the line is changed, the error data EC may be detected.

When the error data EC is generated, the error data. EC may be transmitted to the error control unit 260. In response to the error correction command ECC output by the control logic 300, the error control unit 260 may determine whether the error is correctable by checking whether the number of error bits of the received error data EC is greater than the error correction capability of the memory device 1110.

When it is determined that the error is uncorrectable, the error control unit 260 may transmit the uncorrectable error signal UECC to the control logic 300. Further, the error control unit 260 may decode the error data EC in response to the decoding command DEC. When the result of the decoding operation is successful, the error control unit 260 may output the pass signal DP. When the result of the decoding operation is not successful, the error control unit 260 may output the fail signal DF.

Figure 5:
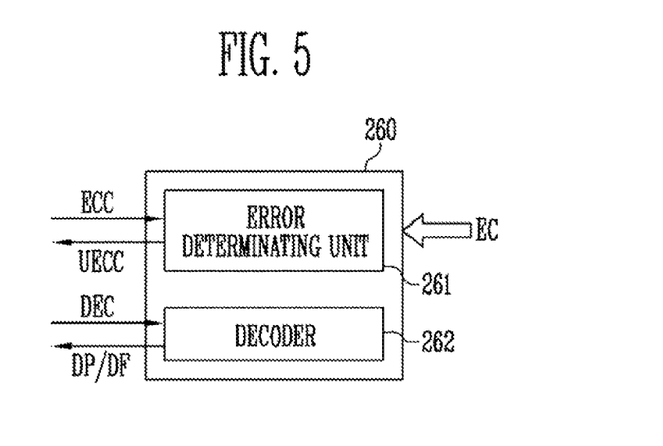
FIG. 5 is a diagram illustrating an error control unit shown in FIGS. 2 and 4.

FIG. 5 is a diagram illustrating the error control unit 260 shown in FIGS. 2 and 4.

Referring to FIG. 5, the error correction unit 260 may include an error determining unit 261 and a decoder 262.

The error determining unit 261 may receive the error data EC in response to the error correction command ECC, and check whether the number of error bits of the received error data EC is greater than the error correction capability of the memory device 1110. For example, when the number of error bits of the received error data bit EC is greater than the error correction capability of the memory device 1110, the error determining unit 261 may enable the uncorrectable error signal UECC. For example, when the number of error bits of the received error data EC is less than or equal to the error correction capability of the memory device 1110, the error determining unit 261 may disable the uncorrectable error signal UECC. For example, the enabled uncorrectable error signal UECC may have a logic value of "1" and the disabled uncorrectable error signal UECC may have a logic value of "0".

The decoder 262 may decode the error data EC in response to the decoding command DEC. When the result of the decoding operation is successful, the decoder 262 may output the pass signal DP. When the result of the decoding operation is not successful, the decoder 262 may output the fail signal DF.

The read operation according to the exemplary embodiment of the present application will be described in detail.

Figure 6:
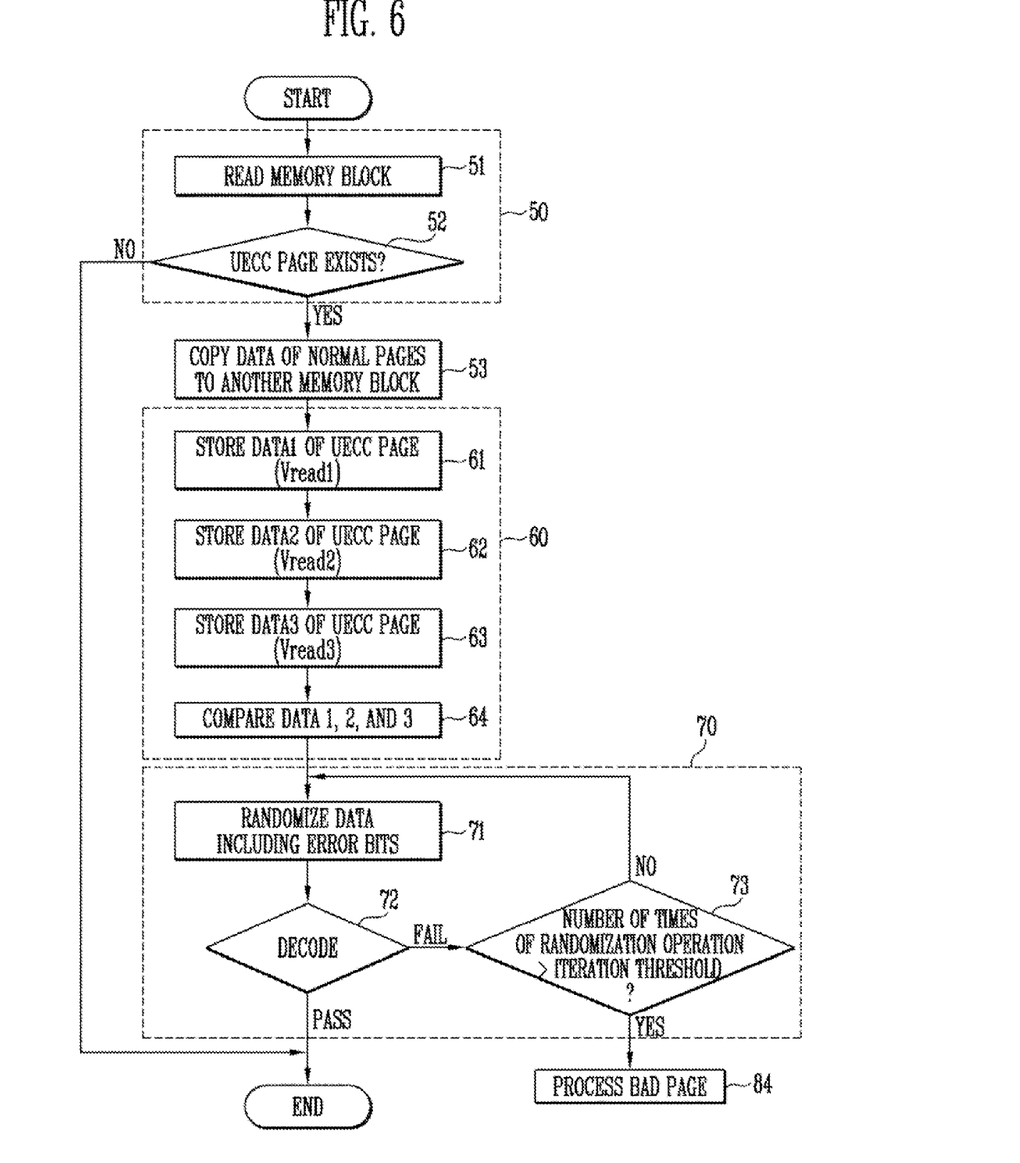
FIG. 6 is a flowchart illustrating an operation of a memory device shown in FIGS. 1 to 5.

FIG. 6 is a flowchart illustrating an operation of the memory device 1110 shown in FIGS. 1 to 5.

Referring to FIG. 6, the operation of the memory device 110 may include a main read operation 50, a data storage operation 60, and a decoding operation 70. Each operation will be described in detail below.

Main Read Operation 50

At step 51, the control logic 300 may control the peripheral circuits 200 to perform the read operation to a selected memory block. The main read operation may be performed in units of pages. For example, the main read operation may be sequentially performed from a page connected to a zero$^{th}$ word line to a page connected to an n$^{th}$ word line. Further, the control logic 300 may control the error control unit 260 to detect an error of the read page or the error data EC of the read page.

At step 52, the error control unit 260 may determine whether the error data EC of the read page is correctable. In this disclosure, the read page having the error data EC, the number of error bits of which is greater than the error correction capability of the memory device 1110, is referred to as an uncorrectable error correction (UECC) page. The error control unit 260 may perform the determination of the UECC page after the read operation to all of the pages of the selected memory block or whenever each page is read. When it is determined that there is no UECC page at step 52, the read operation of the selected memory block may end. When it is determined that there is the UECC page at step 52, a data storage operation 60 may be performed. As an additional operation before the data storage operation 60 is performed, data of normal pages except for the UECC page in the selected memory block may be copied to another memory block at step 53. The additional operation of step 53 may protect data stored in the normal pages during the data restoration operation of the selected memory block.

Data Storage Operation 60

At step 61, the first data DATA1 of the UECC page may be stored in the page buffers PB by performing a first sub read operation. The first sub read operation may be performed by applying a first read voltage Vread1 to the word line connected to the UECC page. The first data DATA1 may be stored in the first latches LAT1 of the page buffers PB. At step 62, the second data DATA2 of the UECC page may be stored in the page buffers PB by performing a second sub read operation. The second sub read operation may be performed by applying a second read voltage Vread2 to the word line connected to the UECC page. The second read voltage Vread2 may be set to be less than the first read voltage Vread1 by a first level. The second data DATA2 may be stored in the second latches LAT2 of the page buffers PB. At step 63, the third data DATA3 of the UECC page may be stored in the page buffers PB by performing a third sub read operation. The third sub read operation may be performed by applying a third read voltage Vread3 to the word line connected to the UECC page. The third read voltage Vread3 may be set to be greater than the first read voltage Vread1 by the first level. The first read voltage Vread1 may be a reference voltage preset in the memory device or an optimal read voltage. The optimal read voltage may be set by a voltage determination method disclosed in Korean Patent Application Laid-Open No. 10-2014-0084298.

At step 64, each of the second and third data DATA2 and DATA3, which are respectively obtained by the second and third read voltages Vread2 and Vread3, may be compared with the first data DATA1 obtained by the first read voltage Vread1. The second and third data DATA2 and DATA3 may have data DATA including one or more bits having values different from corresponding bits of the first data DATA1 since the first to third data DATA1 to DATA3 may be obtained by reading the memory cells included in the UECC page, so that one or more bits of data DATA different from the first data DATA1 exist among the second and third data DATA2 and DATA3. The memory cells corresponding to the data DATA may have the error bits included in the.

Decoding Operation 70

At step 71, the data DATA of step 64 may be randomized. The randomization operation may be performed in various ways. For example, the data DATA of step 64 may be temporarily stored in the page buffer unit 230. The control logic 300 may generate random data, and control the peripheral circuit 200 to generate a randomized data based on the generated random data and the data DATA of step 64 and to store the randomized data in the page buffer unit 230. At step 72, the decoding operation is performed to the randomized data of step 71. The decoding operation may be performed through an ECC operation. During the ECC operation, when the number of memory cells, in which the error is generated, among the memory cells included in the selected page is within the number of correctable memory cells, the decoding operation passes, the decoding operation passes. On the other hand, when the number of memory cells, in which the error is generated, among the memory cells included in the selected page exceeds the number of correctable memory cells, the decoding operation fails. When the decoding operation passes, the error of the randomized data has been corrected and thus the read operation of the selected memory block may end. When the decoding operation fails, the number randomization operations to the selected page PG may be compared with an iteration threshold at step 73. When the number of randomization operations exceeds the iteration threshold, the selected page PG may be processed as a bad page at step 84 and the read operation of the selected memory block may end. When the number of randomization operations is less than or equal to the iteration threshold, the steps 71 to 73 may be repeated. When step 71 of the randomization operation is repeated, the previously randomized data temporarily stored in the page buffer unit 230 may change and thus the success possibility of step 72 of the decoding operation may change according to the currently randomized data. Steps 71 to 73 may be repeated until the step 72 of the decoding operation passes.

As described above, in accordance with an exemplary embodiment of the present application, the selected page may be made correctable through the repetitive randomization of data including the error bits of the selected page even when the number of error bits of the selected page is greater than the error correction capability of the memory device, and therefore the reliability of the memory device and the system including the same may be improved.

Figure 7:
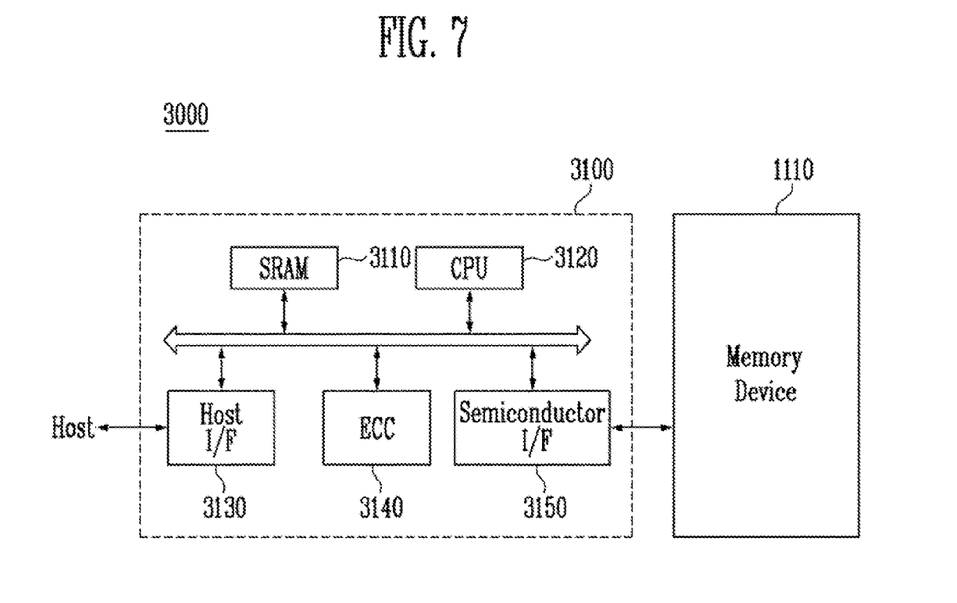
FIG. 7 is a block diagram illustrating a memory system according to an exemplary embodiment of the present application.

FIG. 7 is a block diagram illustrating a memory system according to an exemplary embodiment of the present application.

The memory device 1110 may be the same as described with reference to FIGS. 1 to 6.

The controller 3100 may control the memory device 1110. The SRAM 3110 may be used as a working memory of a CPU 3120. A host interface 3130 may include a data exchange protocol of a host connected with a memory system 3000. An error correction circuit 3140 provided in the controller 3100 may detect and correct an error included in data read from the memory device 1110. A semiconductor interface 3150 may interface with the memory device 1110. The CPU 3120 may perform a control operation for exchanging data of the controller 3100. Further, although not illustrated in FIG. 7, the memory system 3000 may further include a ROM for storing code data for interfacing with the host.

The memory system 3000 according to the present application may be applied to one of a computer, a portable terminal, a Ultra Mobile PC (UMPC), a work station, a net-book computer, a PDA, a portable computer, a web tablet PC, a wireless phone, a mobile phone, a smart phone, a digital camera, a digital audio recorder, a digital audio player, a digital picture recorder a digital picture player, a digital video recorder, a digital video player, a device capable of transceiving information in a wireless environment, and various devices configuring a home network.

Figure 8:
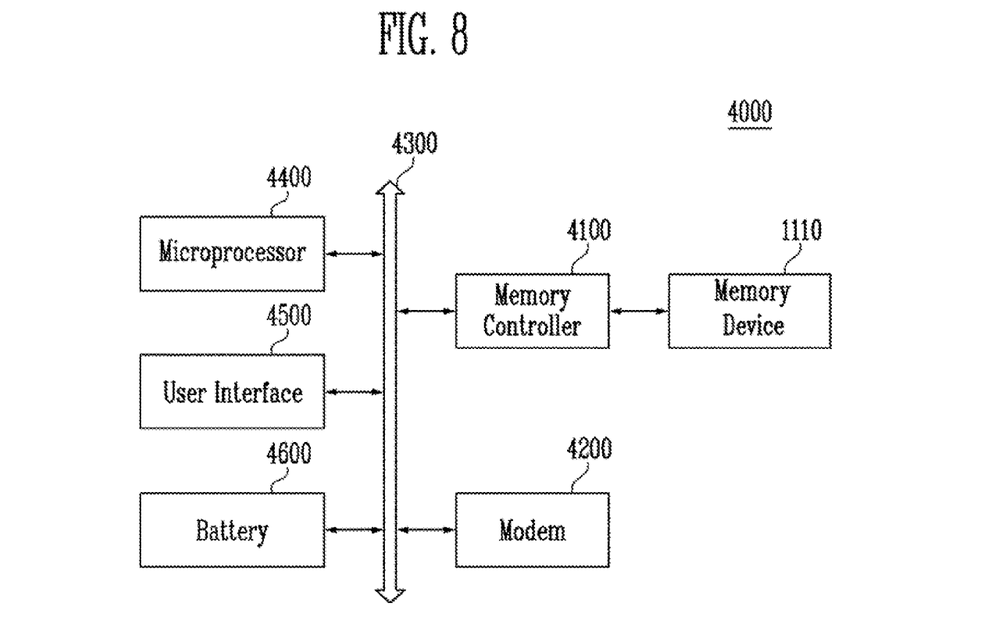
FIG. 8 is a diagram illustrating a computing system including a memory device according to an exemplary embodiment of the present application.

FIG. 8 is a diagram illustrating a computing system including the memory device 1110 according to an exemplary embodiment of the present application.

Referring to FIG. 8, a computing system 4000 according to the present application includes the memory device 1110, a controller 4100, a modem 4200, a microprocessor 4400, and a user interface 4500 which are electrically connected to a bus 4300. When the computing system 4000 according to the present application is a mobile device, a battery 4600 for supplying an operation voltage of the computing system 4000 may be further provided. Although it is not illustrated in the drawing, the computing system 4000 according to the present application may further include an application chipset, a Camera Image Processor (CIS), a mobile DRAM, and the like.

The memory device 1110 may be the same as described with reference to FIGS. 1 to 6.

The controller 4100 and the memory device 1110 may configure an SSD.

The system according to the present application may be mounted by using various types of packages. For example, the present application may be embedded by using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIL), shrink small outline package (SSOP), thin small outline (TSOP), thin quad flat pack (TQFP), system in package (SIP), multi chip package (MCP), wafer-level fabricated package (WFP), and wafer-level processed stack package (WSP).

As described above, embodiments have been disclosed in the drawings and the specification. The specific terms used herein are for illustration, and do not limit the scope of the present application as defined in the claims. Accordingly, those skilled in the art will appreciate that various modifications and another equivalents may be made without departing from the scope and spirit of the present disclosure. Therefore, the scope of the present application will be defined by the accompanying claims.

What is claimed is:

1. A memory device, comprising:
   a plurality of memory blocks suitable for storing data;
   peripheral circuits suitable for temporarily storing data that are read from a selected memory block using various read voltages, performing a randomization operation to the read data, and performing an ECC decoding operation to the randomized data; and
   a control logic suitable for controlling the peripheral circuits to repeat the randomization operation and the ECC decoding operation until the ECC decoding operation is successful,
   wherein when the error is detected in the selected memory block, the control logic controls the peripheral circuits to store the data read by performing sub read operations with different read voltages, compares the read data, and detects the error bit.

2. The memory device of claim 1, wherein the peripheral circuits include:
   a voltage generating circuit suitable for generating read voltages having various levels;
   a row decoder suitable for transmitting the read voltages to the selected memory block;
   a page buffer unit suitable for temporarily storing the data read from the selected memory block or the randomized data;
   a column decoder connected to the page buffer unit through page lines, and suitable for transceiving data with the page buffer unit;
   an input/output circuit connected to the column decoder through column lines, and suitable for transceiving data with an external device; and
   an error control unit suitable for detecting error data of the data stored in the page buffer unit, and determining whether an error is correctable based on the error data and whether the decoding operation passes or fails.

3. The memory device of claim 2, wherein the voltage generating circuit generates a first read voltage, a second read voltage less than the first read voltage by a first level, and a third read voltage greater than the first read voltage by the first level.

4. The memory device of claim 2, wherein the page buffer unit includes a plurality of latches for temporarily storing the data read from the selected memory block.

5. The memory device of claim 2, wherein the error control unit includes:
an error determining unit suitable for receiving the error data in response to an error correction command from the control logic, and determining whether an error is detected based on the error bit; and
a decoder suitable for decoding the error data in response to a decoding command from the control logic.

6. The memory device of claim 5,
wherein when the number of elements of the error data is larger than a threshold value, the error determining unit determines that the error is uncorrectable and activates an uncorrectable error signal, and
wherein when the number of elements of the error data is smaller than the threshold value, the error determining unit determines that the error is correctable and deactivates the uncorrectable error signal.

7. The memory device of claim 5, wherein the decoder outputs a pass signal when the decoding operation passes, and the decoder outputs a fail signal when the decoding operation fails.

8. The memory device of claim 7,
wherein when the pass signal is output, the control logic controls the peripheral circuits to end the read operation of the selected memory block, and
wherein when the fail signal is output, the control logic controls the peripheral circuits to perform the randomization operation and the decoding operation.

9. The memory device of claim 1, wherein the control logic controls the peripheral circuits to read the selected memory block, detect the error bit in the selected memory block, and performs the randomization operation to the selected memory block according to the error bit, and repeat the randomization operation and the decoding operation until the decoding operation passes.

10. The memory device of claim 1, wherein the control logic controls the peripheral circuits to perform the sub read operations using a first read voltage, a second read voltage less than the first read voltage by a first level, and a third read voltage greater than the first read voltage by the first level.

11. The memory device of claim 1, wherein when the read data is different, the control logic controls the peripheral circuits to generate the error bit, and when the read data is the same, the control logic controls the peripheral circuits so as not to generate the error bit.

12. The memory device of claim 9, wherein when the error data is detected in the selected memory block, the control logic further controls the peripheral circuits to copy data of normal cells of the selected memory block to another memory block.

13. A system, comprising:
a storage device; and
a host suitable for controlling the storage device,
wherein the storage device performs a plurality of read operations of a selected memory block using various read voltages, and temporarily stores data read from the selected memory block, and repeats a randomization operation to the read data and an ECC decoding operation to the randomized data when it is determined that an error of read data is uncorrectable, wherein the randomization operation and the ECC decoding operation are repeated until the error of read data is correctable, and
wherein when the error is detected in the selected memory block, the storage device stores the data read by performing sub read operations with different read voltages, compares the read data, and detects the error bit.

14. The system of claim 13, wherein the storage device includes:
a memory device suitable for storing data; and
a memory control unit suitable for controlling data exchange between the host and the memory device.

15. The system of claim 14, wherein the memory device includes:
a plurality of memory blocks suitable for storing data;
peripheral circuits suitable for temporarily storing data read from a selected memory block, performing a randomization operation to the read data, and performing an ECC decoding operation to the randomized data; and
a control logic suitable for controlling the peripheral circuits to repeat the randomization operation and the ECC decoding operation until the ECC decoding operation is successful.

16. The system of claim 15, wherein the peripheral circuits include:
a voltage generating circuit suitable for generating read voltages having various levels;
a row decoder suitable for transmitting the read voltages to the selected memory block;
a page buffer unit suitable for temporarily storing the data read from the selected memory block or the randomized data;
a column decoder connected to the page buffer unit through page lines, and suitable for transceiving data with the page buffer unit;
an input/output circuit connected to the column decoder through column lines, and suitable for transceiving data with an external device; and
an error control unit suitable for detecting error data of the data stored in the page buffer unit, and determining whether an error is correctable based on the error data and whether the decoding operation passes or fails.

17. The system of claim 16, wherein the error control unit includes:
an error determining unit suitable for receiving the error data in response to an error correction command from the control logic, and determining whether an error is detected based on the error data; and
a decoder suitable for decoding the error data in response to a decoding command from the control logic.

18. The system of claim 16,
wherein when the number of elements of the error data is larger than a threshold value, the error determining unit determines that the error is uncorrectable and activates an uncorrectable error correction code, and
when the number of elements of the error data is smaller than the threshold value, the error determining unit determines that the error is correctable and does not activate an uncorrectable error correction code.

19. The system of claim 16, wherein the decoder outputs a pass signal when the decoding operation passes, and the decoder outputs a fail signal when the decoding operation fails.

* * * * *